US006297531B2

(12) United States Patent
Armacost et al.

(10) Patent No.: US 6,297,531 B2
(45) Date of Patent: *Oct. 2, 2001

(54) HIGH PERFORMANCE, LOW POWER VERTICAL INTEGRATED CMOS DEVICES

(75) Inventors: Michael D. Armacost, Wallkill, NY (US); Claude L. Bertin, South Burlington; Erik L. Hedberg, Essex Junction, both of VT (US); Jack A. Mandelman, Stormville, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/002,399

(22) Filed: Jan. 5, 1998

(51) Int. Cl.$^7$ ................................................. H01L 29/76
(52) U.S. Cl. ..................... 257/329; 257/331; 257/334; 257/369; 257/903
(58) Field of Search .................................. 257/329, 330, 257/331, 334, 401, 369, 903

(56) References Cited

U.S. PATENT DOCUMENTS

| 3,761,782 | 9/1973 | Youmans ................. 317/234 |
|---|---|---|
| 3,884,733 | 5/1975 | Bean ...................... 148/175 |
| 3,986,196 | 10/1976 | Decker et al. ............ 357/22 |
| 4,296,428 | 10/1981 | Haraszti .................. 357/41 |
| 4,462,040 | 7/1984 | Ho et al. ................. 357/23 |
| 4,466,173 | 8/1984 | Baliga ..................... 29/571 |
| 4,507,674 | 3/1985 | Gaalema .................. 357/30 |
| 4,530,149 | 7/1985 | Jastrzebski et al. ...... 29/571 |
| 4,554,570 | * 11/1985 | Jastrzebski et al. ...... 257/331 |
| 4,566,025 | * 1/1986 | Jastzebski et al. ....... 257/331 |
| 4,624,004 | 11/1986 | Calviello ................. 357/22 |

(List continued on next page.)

FOREIGN PATENT DOCUMENTS 60-233911    11/1985   (JP).

OTHER PUBLICATIONS

M.E. Kcker, Interconnecting Monolithic Circuit Elements, IBM Technical Disclosure Bulletin, vol. 10 No. 7, Dec. 1967, p. 883.

E.I. Alessandrini & R.B. Laibowitz, Epitaxial Double–Sided Circuitry, IBM Technical Disclosure Bulletin, vol. 25 No. 10, Mar. 1983, pp. 5043–5044.

R.R. Garnache, Complimentary FET Memory Cell, IBM Technical Disclosure Bulletin, vol. 18 No. 12, May 1976, pp. 3947–3948.

*Primary Examiner*—Mark V. Prenty
(74) *Attorney, Agent, or Firm*—McGuireWoods, LLP; Howard J. Walter, Jr.

(57) ABSTRACT

A vertical Field Effect Transistor (FET) that may be an N-type FET (NFET) or a P-type FET (PFET); a multi-device vertical structure that may be two or more NFETs or two or more PFETS; logic gates including at least one vertical FET or at least one multi-device vertical; a Static Random Access Memory (SRAM) cell and array including at least one vertical FET; a memory array including at least one such SRAM cell; and the process of forming the vertical FET structure, the vertical multi-device (multi-FET) structure, the logic gates and the SRAM cell. The vertical FETs are epitaxially grown layered stacks of NPN or PNP with the side of a polysilicon gate layer adjacent the device's channel layer. The multi-FET structure may be formed by forming sides of two or more gates adjacent to the same channel layer or, by forming multiple channel layers in the same stack, e.g., PNPNP or NPNPN, each with its own gate, i.e., the side of a polysilicon gate layer. The SRAM cell may be radiation hardened by selectively thickening gate layers to increase storage node capacitance, providing high resistance cell wiring or by including a multi-layered gate oxide layer of NO or ONO, or by any combination thereof.

33 Claims, 15 Drawing Sheets

U.S. PATENT DOCUMENTS

| | | | |
|---|---|---|---|
| 4,675,717 | 6/1987 | Herrero et al. | 357/71 |
| 4,692,791 | 9/1987 | Bayraktaroglu | 357/81 |
| 4,767,722 | 8/1988 | Blanchard | 437/41 |
| 4,794,093 | 12/1988 | Tong et al. | 437/203 |
| 4,807,022 | 2/1989 | Kazior et al. | 357/81 |
| 4,810,906 | 3/1989 | Shah et al. | 307/448 |
| 4,889,832 | 12/1989 | Chatterjee | 437/203 |
| 4,927,784 | 5/1990 | Kazior et al. | 437/203 |
| 4,951,102 | 8/1990 | Beitman et al. | 357/23.4 |
| 4,956,687 | 9/1990 | de Bruin et al. | 357/30 |
| 4,982,266 | 1/1991 | Chatterjee | 357/71 |
| 5,001,526 | 3/1991 | Gotou | 357/23.6 |
| 5,021,845 | 6/1991 | Hashimoto | 357/23.4 |
| 5,027,189 | 6/1991 | Shannon et al. | 357/71 |
| 5,032,529 | 7/1991 | Beitman et al. | 437/21 |
| 5,034,347 | 7/1991 | Kakihana | 437/187 |
| 5,057,450 | 10/1991 | Bronner et al. | 437/62 |
| 5,063,177 | 11/1991 | Geller et al. | 437/209 |
| 5,072,276 | 12/1991 | Malhi et al. | 357/42 |
| 5,134,448 | 7/1992 | Johnsen et al. | 357/23.4 |
| 5,252,849 | 10/1993 | Fitch et al. | 257/329 |
| 5,292,686 | 3/1994 | Riley et al. | 437/173 |
| 5,293,053 | 3/1994 | Malhi et al. | 257/330 |
| 5,322,816 | 6/1994 | Pinter | 437/203 |
| 5,343,071 | 8/1994 | Kazior et al. | 257/621 |
| 5,354,711 | 10/1994 | Heitzmann et al. | 437/182 |
| 5,414,289 * | 5/1995 | Fitch et al. | 257/329 |
| 5,449,930 | 9/1995 | Zhou | 257/197 |
| 5,455,064 | 10/1995 | Chou et al. | 427/79 |
| 5,528,080 | 6/1996 | Goldstein | 257/741 |

* cited by examiner

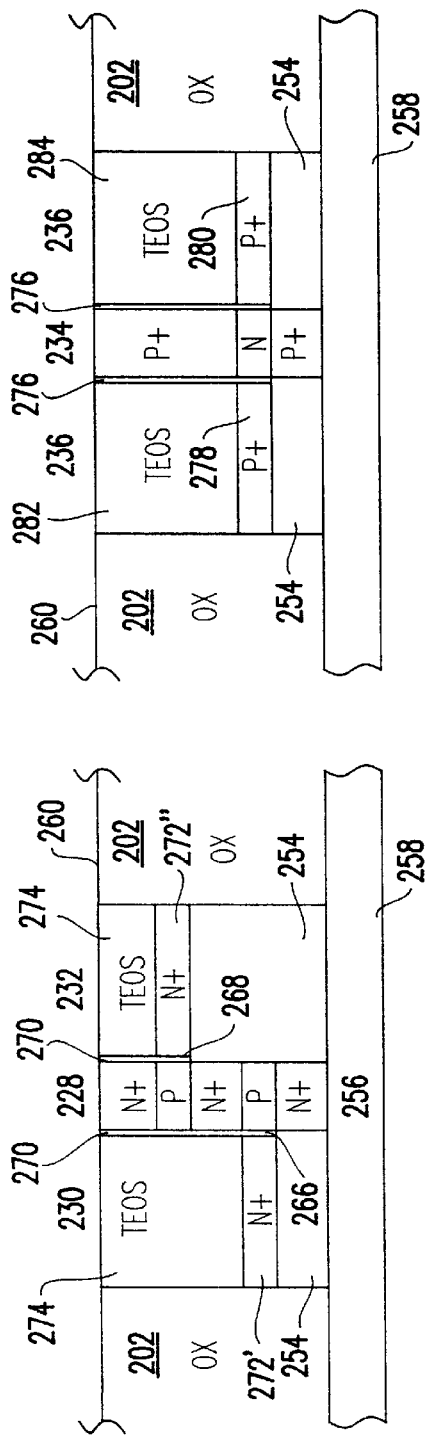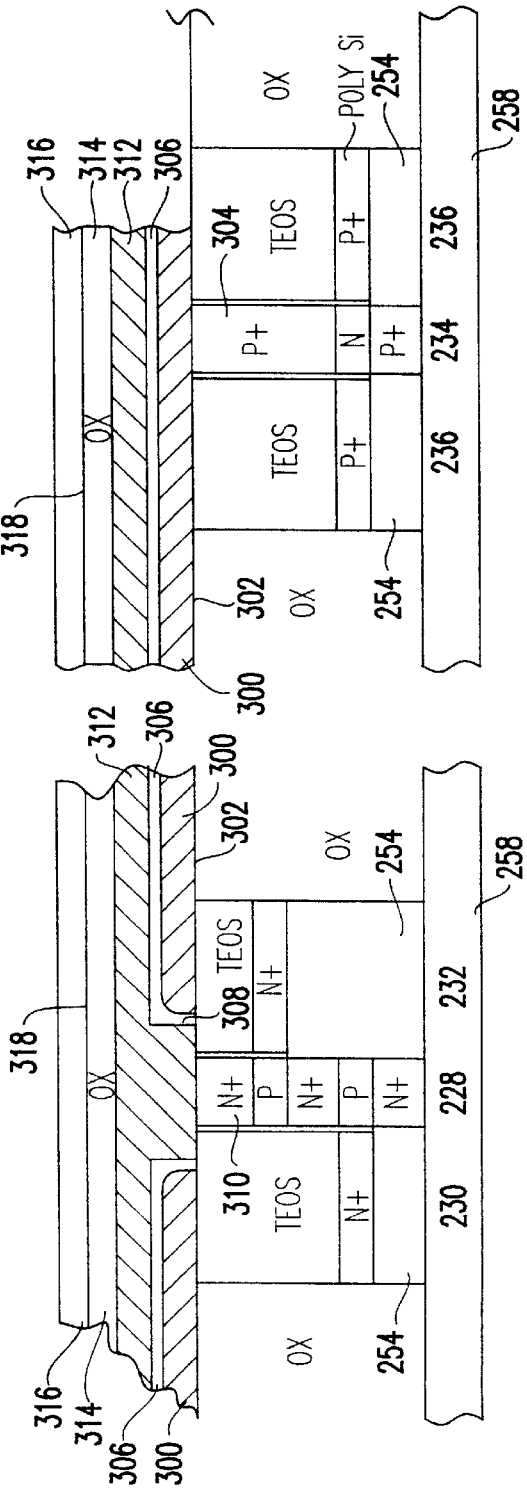
FIG.10H
FIG.12A

HIGH PERFORMANCE, LOW POWER VERTICAL INTEGRATED CMOS DEVICES

RELATED APPLICATION

The present invention is related to U.S. patent application Ser. No. 08/002,825, filed on Jan. 5, 1998, the contents of which are also incorporated by reference herein.

BACKGROUND OF THE INVENTION

1. Field of the Invention

The present invention is related to integrated circuit (IC) chips and more particularly, to IC chips with CMOS SRAM cells and logic.

2. Background Description

Integrated circuit (IC) chip developers' primary goals are faster, denser, lower power IC chips. Typical, state of the art IC chips are manufactured, currently, in the complementary insulated gate Field Effect Transistor (FET) technology, commonly referred to as CMOS. Normally, each generation of CMOS technology is identified by its minimum feature size, e.g. ▓half micron CMOS▓ or ▓quarter micron CMOS▓. Reducing the minimum feature size is the usual approach to making CMOS chips faster and denser simultaneously with reducing power.

Since the active area (channel region) of any given circuit amounts to less than 10% of the entire area of the circuit, designers are acutely aware that, no matter how small a circuit is, circuit area may still be reduced. However, reducing feature size alone may lead to problems that require other, non-geometric solutions, such as enhanced circuit wiring layers. Even using these state of the art non-geometric enhancements, circuit area reduction falls far short of 90%.

Reducing inactive area in an individual logic gate might have an insignificant impact on overall chip density. By contrast, reducing cell size in a Random Access Memory (RAM) array translates to a corresponding chip density improvement.

However, benefits from reducing RAM cell area are often offset by increased radiation sensitivity. Even Static RAM (SRAM) cells become sensitive at some point to alpha particle or cosmic ray radiation. While these effects are exacerbated by reduced SRAM operating voltages, they may be offset by adding selected process features, such as selective cell node capacitance enhancement and increased cell wiring resistance. Unfortunately, these additional features increase SRAM cell size and write time.

Consequently, designers have resorted to other approaches to reducing cell and circuit area, such as vertical devices, e.g., U.S. Pat. No. 5,414,289 to Fitch et al. entitled ▓Dynamic Memory Device Having a Vertical Transistor▓.

Fitch et al. teaches opening a hole through a conductor layer (the gate) that is sandwiched by two dielectric layers. A thin dielectric layer (gate oxide) is grown on the sides of the gate conductor layer in the hole. This gate oxide layer is a rough indicator of when channel growth should begin and when it should end. Consequently, Fitch et al.'s vertical FETs have substantial gate-drain and gate-source overlap with its associated overlap capacitance, which may be undesirable. This overlap capacitance is part of circuit load capacitance and contributes to other performance problems, such as Miller Effects.

CMOS circuit power is largely a function of supply voltage ($V_h$), circuit load capacitance ($C_L$) and operating frequency (i.e., chip clock frequency $f_{clk}$). The general CMOS circuit power (P) formula is $P=C_L V_h^2 f_{clk}$. Thus, improving performance (increasing $f_{clk}$) and reducing power, requires reducing either $C_L$ or $V_h$ or both.

Although, with each feature size reduction, usually, there has been a corresponding reduction in $V_h$, this has not been the case with $C_L$. Furthermore, as feature size shrinks, wiring resistance (i.e., per unit line resistance) increases, increasing RC propagation delays, which offsets some performance gains.

Thus, there is a need for CMOS technologies with reduced power supply voltage levels, reduced parasitic capacitance and wiring per unit length resistance, as well as reduced critical CMOS device parameters, such as channel length.

SUMMARY OF THE INVENTION

It is a purpose of the invention to improve FET channel length control.

It is a goal of this invention to reduce FET channel length variations.

It is another purpose of the present invention to improve CMOS logic and SRAM cell performance.

It is yet another purpose of the present invention to improve SRAM cell radiation hardness without degrading cell performance.

It is yet another purpose of the present invention to simultaneously achieve high speed and high density CMOS logic circuits, at low power dissipation levels.

The present invention is a vertical Field Effect Transistor (FET) that may be an N-type FET (NFET) or a P-type FET (PFET), a multi-device vertical structure that may be two or more NFETs or two or more PFETs, logic gates including at least one vertical FET or at least one multi-device vertical structure, a Static Random Access Memory (SRAM) cell and array including at least one vertical FET, a memory array including at least one such SRAM cell and the process of forming the vertical FET structure, the vertical multi-device structure, the logic gates and the SRAM cell.

The preferred vertical FETs are epitaxially grown layered stacks of NPN (for a NFET) or PNP (for a PFET). The side of a gate layer, preferably polysilicon, adjacent channel layer(s) in the stack is the gate of the device. The preferred multi-FET structure may be formed from the same channel layer by forming sides of two or more gates or, by stacking multiple channel layers in the same stack, e.g., PNPNP or NPNPN, each channel layer with its own gate, i.e., the side of a polysilicon gate layer. Two of these preferred multi-FET structures may be combined to form a CMOS logic gate by connecting together one end of each stack and connecting corresponding gates together. The preferred SRAM cell, made from the preferred embodiment FETs, may be radiation hardened by selectively thickening gate layers to increase storage node capacitance, providing high resistance cell wiring, including a multi-layered gate oxide layer of NO or ONO, or by any combination thereof.

BRIEF DESCRIPTION OF THE DRAWINGS

The foregoing and other objects, aspects and advantages will be better understood from the following detailed description of a preferred embodiment of the invention with reference to the drawings, in which:

FIGS. 10A–H are cross-sectional views illustrating the steps in forming a two input logic gate;

FIGS. 12A–C are cross-sectional views illustrating the steps in forming appropriate connections for Ground, $V_h$, two (2) inputs and an output on the logic gate in FIGS. 10A–H and 11A–B.

DETAILED DESCRIPTION OF A PREFERRED EMBODIMENT OF THE INVENTION

Figure 1:
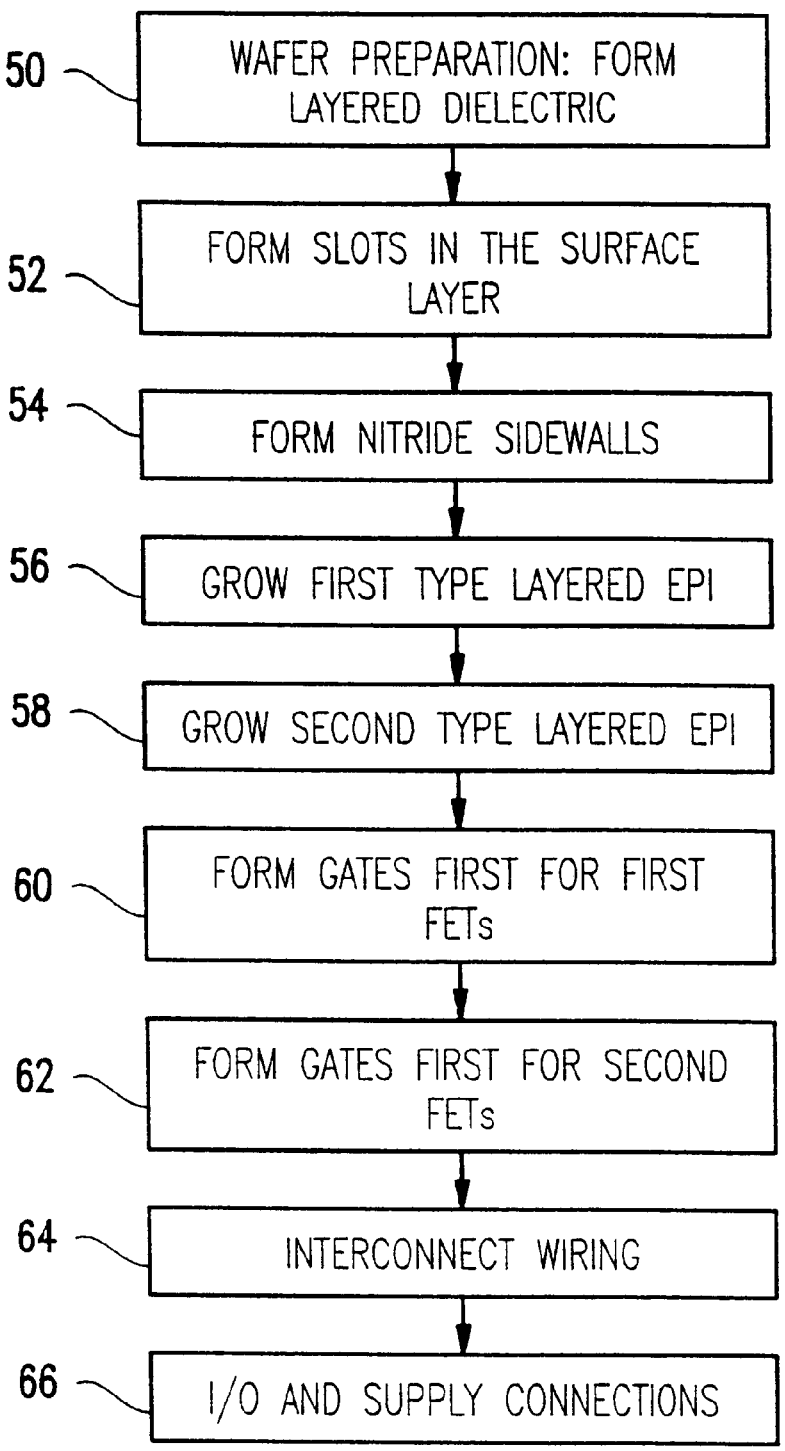
FIG. 1 is a flow diagram for forming FETs according to a preferred embodiment of the present invention.

FIG. 1 is a flow diagram for forming FETs according to a preferred embodiment of the present invention.

In its simplest form, the preferred embodiment of the present invention is a self-aligned vertical FET having both device characteristics and reduced device parasitic capacitance such as would normally be found in a self-aligned Silicon on Insulator (SOI) device. The preferred embodiment FET may be a short channel (0.1 micrometer (um)) N-type FET (NFET) or P-type FET (PFET). Complementary pairs of preferred self-aligned vertical devices (NFET:PFET) may be combined to provide CMOS equivalent circuits, e.g., a complementary pair of self-aligned preferred vertical devices (an NFET and a PFET) may be used as an inverter. Typical $V_h$ for a preferred embodiment circuit of preferred embodiment devices is <1.5V.

Preferred embodiment FETs are formed on the surface of a semiconductor wafer, preferably a silicon wafer. A layered dielectric is formed on a surface of the silicon wafer. Thus, in step 50 the wafer is prepared, first by doping the silicon wafer with impurities to form a heavily doped buried layer. Preferably, the wafer is implanted with Boron to a concentration of $1.0 \times 10^{20} cm^{-3}$. Then, a layered dielectric is formed on the silicon wafer by depositing an oxide layer, a 0.5–1.0 micrometer (um) thick $SiO_2$ layer, on the silicon wafer using chemical vapor deposition (CVD). Then a surface layer of nitride is formed on the oxide layer.

Figure 2A:
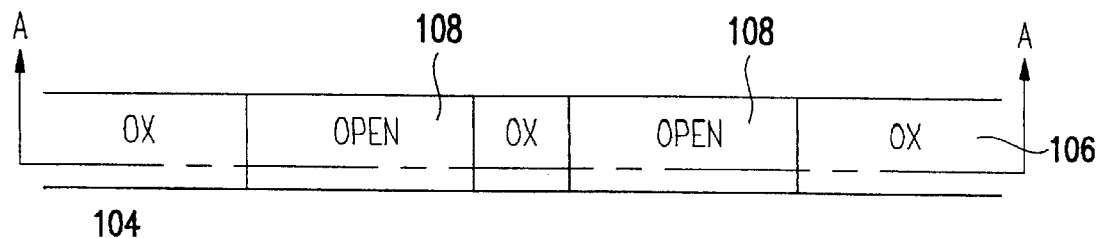
FIGS. 2A–B are, respectively, a top view of a wafer and a cross-sectional view through the wafer after the first step in forming an individual vertical FET according to the preferred embodiment of FIG. 1.
Figure 2B:
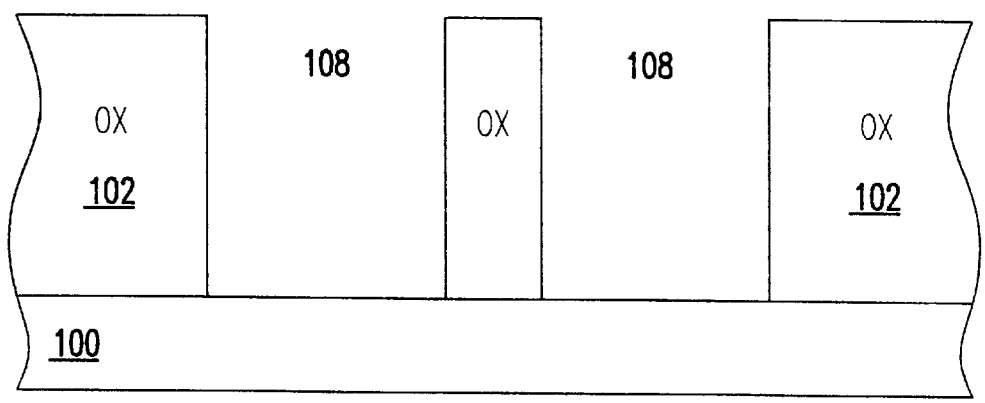

Having prepared the wafer in step 50, slots are formed in the layered dielectric in step 52. FIG. 2A is a top view of a wafer after step 52 in forming a first preferred embodiment FETs. In this embodiment, individual devices are formed in each location, although two or more individual FETs may share a common gate. FIG. 2B is a cross-sectional view of the wafer area in FIG. 2A through A—A. The layered wafer is a silicon wafer 100 covered with an oxide layer 102, and a nitride (SiN) surface layer 104 on the oxide layer 102.

First, trenches 106 are opened through the nitride surface layer 104, exposing the oxide layer 102 therebelow. The trenches 106 define slots 108 that are opened through the oxide layer 102 to the silicon wafer 100. The slots may be minimum features sized or any appropriately larger size. Preferably, the slots 108 are oriented along the wafer's <100> plane to maximize carrier mobility and minimize surface state density.

Figure 3A:
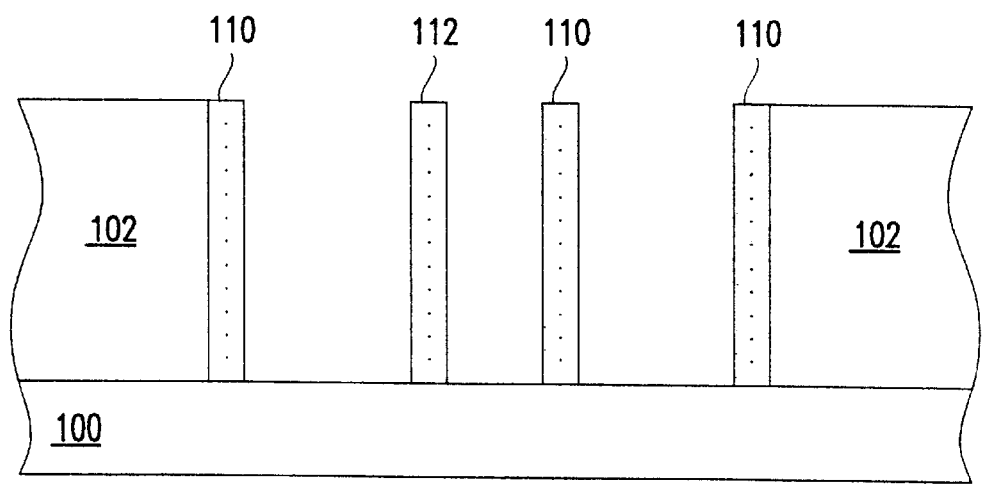
FIGS. 3A–F are cross-sectional views illustrating the steps in forming one or more preferred embodiment FETs.
Figure 3B:
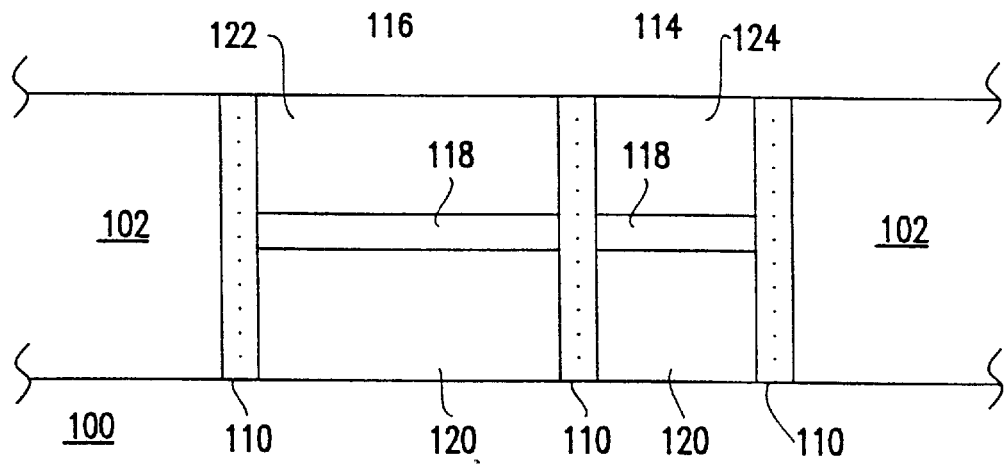

Next, in step 54 as represented in FIG. 3A, nitride sidewall spacers 110, 112 are formed in the slots 108. A conformal nitride layer is deposited over the trench 106 and into the slots 108. The nitride layer is then etched using a Reactive Ion Etch (RIE) to remove the horizontal portions of the nitride layer from the surface, leaving sidewall spacers 110, 112 standing, lining the oxide in the slots 108. Then the oxide is selectively removed between adjacent slots 108, leaving nitride sidewall spacers 110, 112 behind. For the preferred embodiment individual device, sidewall spacer 112 is selectively removed to form vertical device region 114 and gate region 116, in FIG. 3B.

In step 56, vertical silicon columns, which include layers 118 and 120, are grown epitaxially from silicon base layer 100 in regions 114 and 116. If the vertical device is to be an NFET, layer 118 is P-type silicon and layer 120 is N-type. Otherwise, if the vertical device is to be a PFET, layer 118 is N-type and layer 120 is P-type.

The thickness of channel layer 118 determines the device channel length. Thus, because epitaxial layer thickness can be controlled precisely, preferred embodiment FETs, have much less channel length variation than prior art FETs form using conventional methods.

So, for example, a 0.1 um nominal channel length, formed using a conventional technique would exhibit a variation of ±30 nm, which corresponds to a channel length ranging from 0.07 um to 0.13 um, nearly a 2× channel length variation. By contrast, the preferred epi technique provides a much tighter variation of ±5 nm, with a corresponding tight channel length range of from 0.95 um to 0.105 um, only a 1.1× variation. The preferred embodiment channel length design point may be reduced beyond the point where short channel effects would typically become a yield concern because of this improved channel length control. Thus, performance, power and density are improved, significantly over conventional techniques.

Before completing epitaxial growth, a tetra-ethyl-oxysilane (TEOS) plug 122 is formed in the gate region 116. TEOS is deposited on layer 118, planarized and, then, selectively removed from vertical device region 114, using an etch that is selective to nitride and silicon. After forming the TEOS plug 122, a final device layer 124 is grown epitaxially on layer 118 in device region 114. The final device layer 124 has the same conductivity type as layer 120, i.e., either both are P-type or, both are N-type. Thus, the preferred embodiment FET's source and drain are in layers 120 and 124.

Figure 3C:
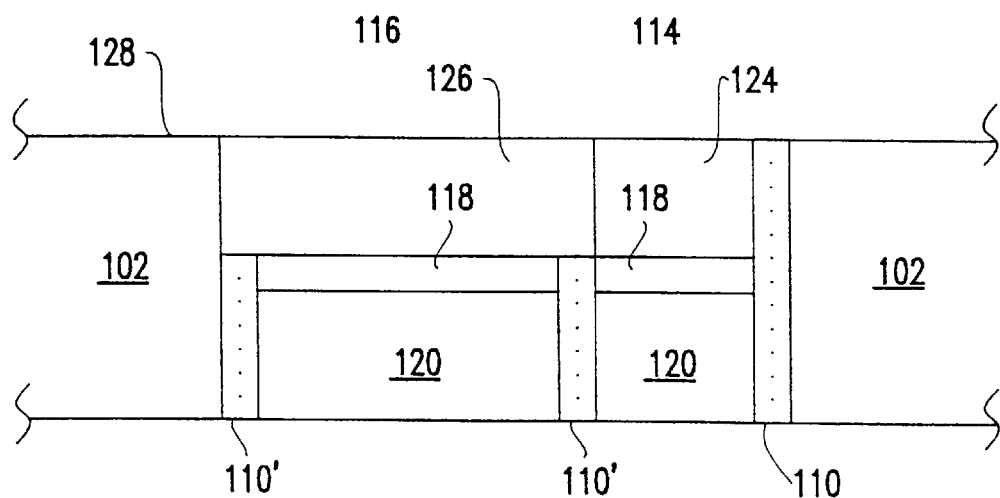

TEOS plug 122 is removed, exposing nitride sidewall spacer 110. The exposed portion of nitride sidewall spacer 110 is removed in gate region 116, leaving partial spacers 110' in FIG. 3C and, partially exposing the sidewall of device region 114. An oxide spacer 126 is formed along the exposed sidewall of device region 114. Then, the upper surface 128 is planarized.

After forming layered epi in device regions 114 and 116 for one device type in step 58, second device type layered epi columns are formed in identical device regions (not shown), essentially as described above for step 56. Thus, if the layered epi formed in step 56 is for NFETS, then, the layered epi formed in step 58 is for PFETs. Optionally, if only one device type is to be formed, step 58 may be omitted.

Figure 3D:
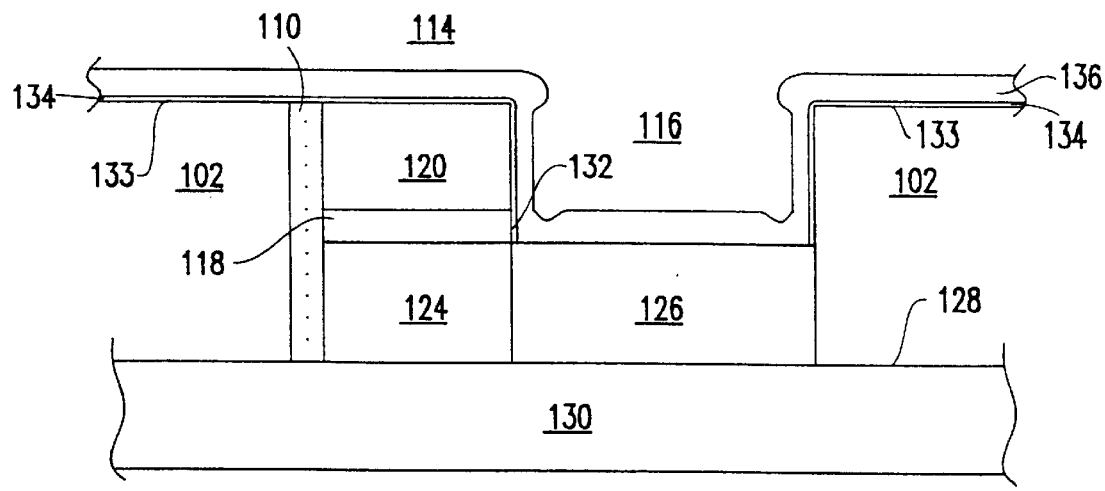

A handle wafer 130 in FIG. 3D is attached to planarized surface 128 and the wafer is inverted to remove the semiconductor base wafer 100. The base wafer 100 is removed in two steps, using both Chem-Mech Polishing (CMP) and etching. The preferred two step removal utilizes the heavily doped layer (not shown), implanted into the base wafer in preparation step 50, as an etch stop layer. So, the bulk of the base layer 100 is removed at a relatively rapid rate (using etch and CMP) down to the etch stop layer. Then, the remainder is removed at a slower, more controlled rate until essentially the entire base layer 100 is removed to expose surface 133 in FIG. 3D. In an alternate embodiment, the base layer is etched using RIE until oxide by-products are detected.

After removing the base layer 100, in step 60, gates are formed for the first type devices. Silicon layers 118 and 120 are removed in the gate region 116 to re-expose sidewall spacers 110'. Then, the re-exposed sidewall spacers 110' are removed, preferably by isotropic etching, to expose the vertical channel surface 132, i.e., the side of layer 118. Next a gate oxide layer 134 is grown on the exposed silicon and a gate layer 136, preferably of polysilicon, is formed on the gate oxide layer 134. The gate layer 136 is, preferably, the same thickness as, or slightly thicker than, channel layer 118 to assure slight gate overlap from the channel 132 into the source/drain diffusion layer 120.

In the preferred embodiment FET, the gate layer 136 is, preferably, a doped polysilicon layer 136, directionally deposited by collimated sputtering from a silicon target. As a result of collimated sputtering, the deposited silicon exhibits a ※breadloafing※ effect wherein polysilicon collects at the opening in surface 133 in the gate regions. The collected polysilicon shadows the sidewalls, resulting in thinner polysilicon sidewalls in gate region 116 from reduced deposition there. So, as a result of this breadloafing effect, polysilicon on the horizontal surfaces, i.e., 133 and oxide fill 126, is much thicker than on the sidewalls. So, for example, polysilicon may be 1500Å on horizontal surface 133 and oxide fill 126 verses only 500Å along the sidewalls.

Figure 3E:
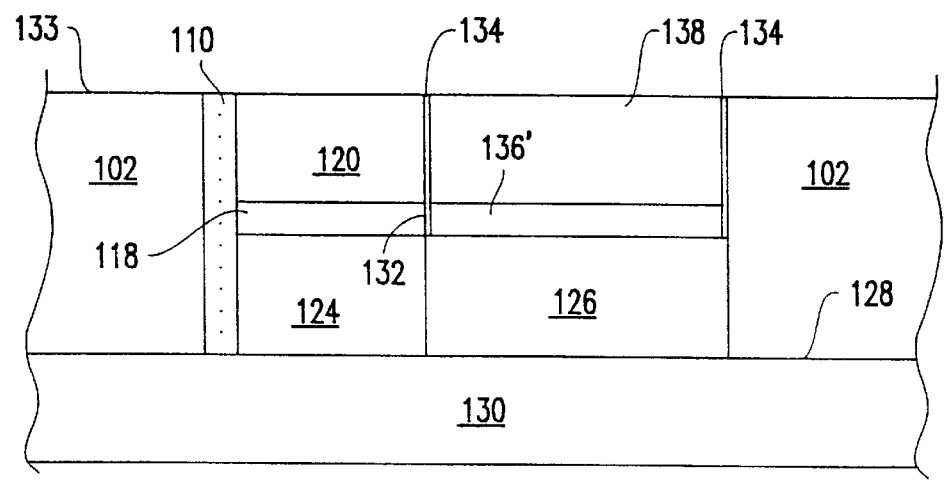

Thus, the sidewall areas of gate layer 136 may be removed using an isotropic chemical dry etching (CDE), leaving polysilicon only on horizontal surface 133, oxide spacer 126, and in gate regions 116. The resulting FET gate 136' in FIG. 3E is thick enough to span the entire channel 132 without excessive overlap. Insulating material, preferably TEOS, is deposited on the wafer. Excess insulating material and surface polysilicon are removed from the wafer's surface, preferably using CMP, which replanarizes surface 133 and leaving an insulating plug 138 above the gate 136'.

Next, in step 62, gates are formed for the second type FETs, essentially as described for the first type FETs. If the step 58 of growing the second type layered epi was omitted, then this step is also omitted.

Figure 3F:
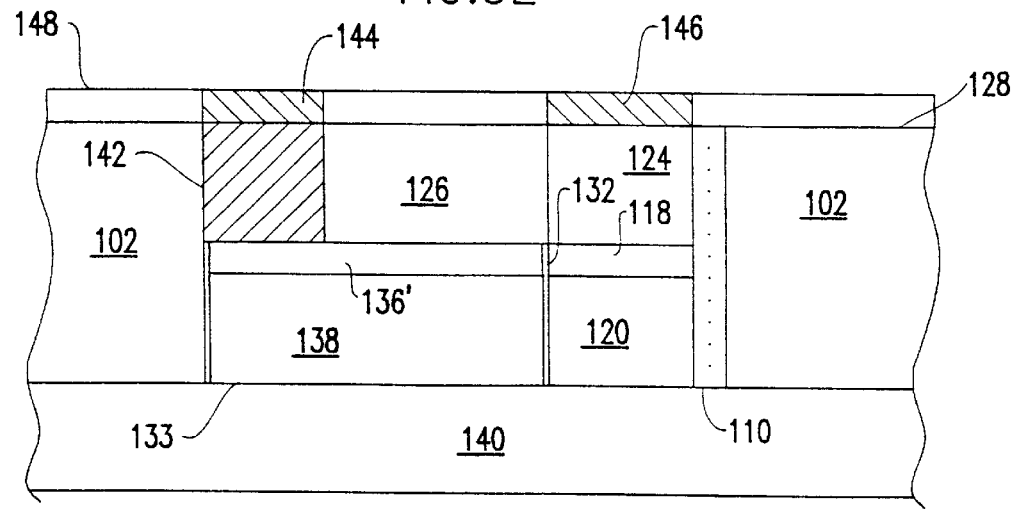

After forming the preferred individual FETs, in step 64, contacts may be formed selectively to the FET's source, drain and gate. In preparation for forming these contacts, a second handle wafer 140 in FIG. 3F is attached to planarized surface 133 and the first handle wafer 130 is removed. The wafer is inverted, patterned and contacts 142 are formed through oxide fill 126, preferably using RIE to open vias to gates 136'. Then, the open vias are filled with a conductor, preferably Tungsten, and the surface 128 is re-planarized, using an appropriate CMP technique.

A metal wiring pattern is formed on the planarized surface 128. The wiring pattern includes conductors 146 to gate contacts 142 and conductors 144 to device source/drain diffusions 124. Oxide is formed on the surface 128 filling spaces between wiring lands, e.g., between 144 and 146. The oxide is planarized forming planar surface 148.

Finally, in step 66, supply, ground and external I/O connections are made to complete the preferred embodiment vertical FETS.

As described hereinabove, the length of such a device is the thickness of the channel layer 118, nominally 0.1 um. The device width is determined by slot width and varies from a minimum, as determined by minimum feature size, to any selected maximum width. Thus, it can be seen that even for a quarter micron process, with a 0.25 um minimum feature size, the width to length (w/l) ratio of a minimum device is 2.5 and increases rapidly with slot width.

It can be readily appreciated that, by providing appropriate wiring to six such preferred embodiment FETs, a SRAM cell may be formed. Four minimum w/l devices are connected to form a latch with two wider pass gate devices between the latch and a pair of bit lines. However, without additional gate contacts/wiring, including pass through contacts, optimum SRAM cell density, performance and stability is still not achievable.

Figure 4A:
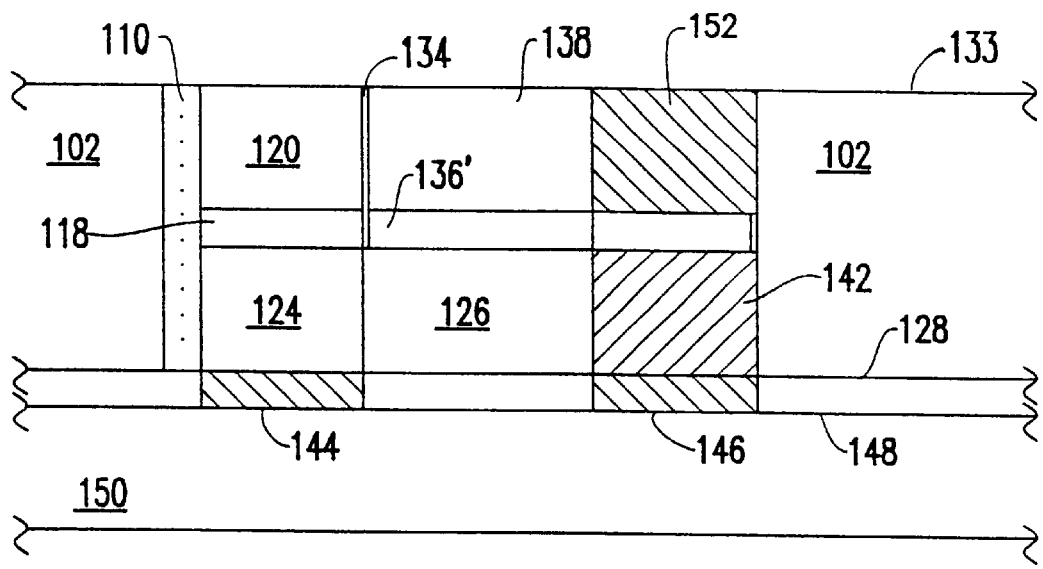
FIGS. 4A–B are cross-sectional views of the above preferred embodiment FET as in FIG. 3F after the optional enhancement steps of forming pass through contacts.
Figure 4B:
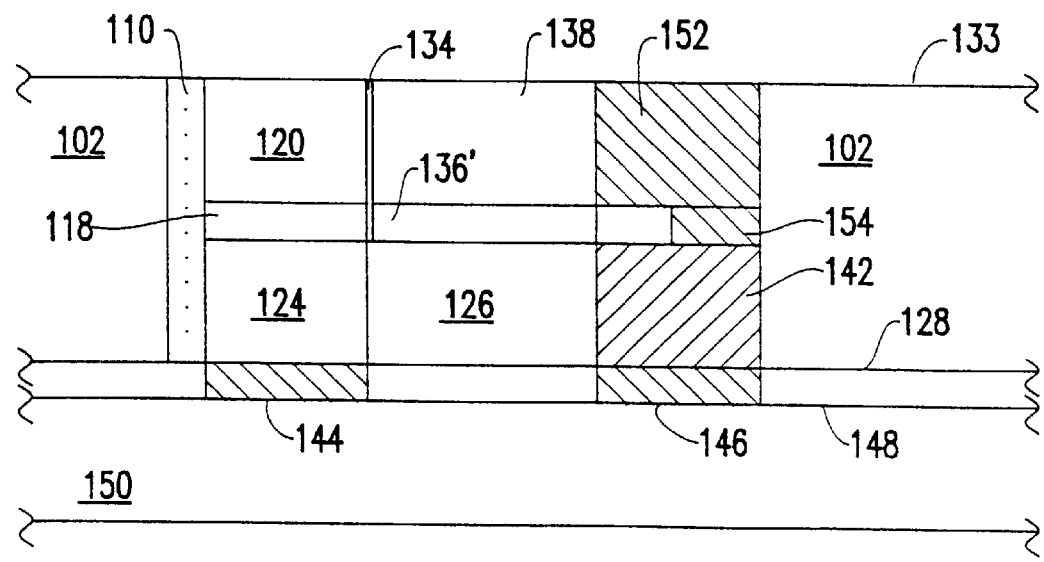

Thus, FIGS. 4A–B represent an above preferred embodiment FET as in FIG. 3F including the additional optional pass through contacts or contact vias. These optional pass through contacts are formed after the structure of FIG. 3F. A third handle wafer 150 is attached to planar surface 148 and the second handle wafer 140 is removed. Again, the wafer is inverted and vias 152, in FIG. 4A, are formed through plugs 138. The vias 152 are filled with an appropriate conducting material and surface 133 is replanarized. As with surface 128 in FIG. 3F, a wiring layer may be applied to surface 133. Thus, having added the capability of contacting the gate layer 136' from above or below, or both, these top and bottom contacts may be selectively omitted from individual devices to provide added wiring flexibility.

Optionally, in FIG. 4B, prior to filling vias 152 with conducting material, a second via 154' may be opened through gate layer 136' to contact 142. Then, both vias 152 and 154 are filled with conducting material and surface 133 is replanarized.

Figure 5:
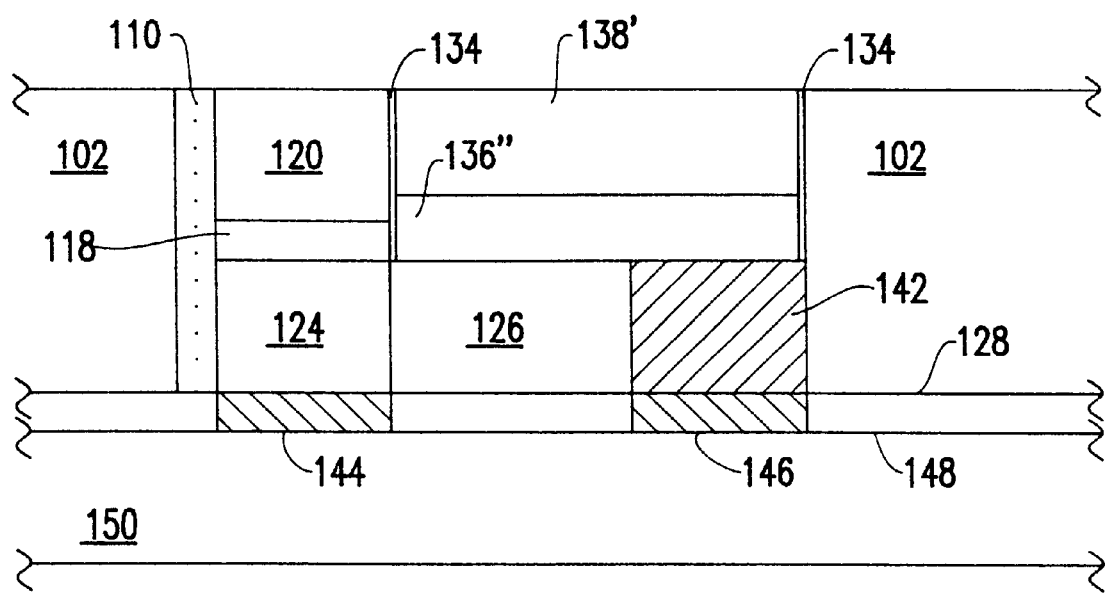
FIG. 5 is a cross-sectional view of the above preferred embodiment FET as in FIG. 3F with a thickened gate layer.

Further enhancements may be added to the preferred embodiment FETs to improve SRAM radiation hardness. For example, in FIG. 5 gate 136" is selectively thickened to increase gate overlap capacitance. Inclusion of such a device in an SRAM cell increases storage node capacitance, which increases the charge required for a transient, such as an alpha particle, to upset the cell. Selective thickening of the gate layer 136" in FIG. 5 is accomplished when the gate layer is deposited in step 60 and/or step 62. Typically, the gates of all vertical FETs, all vertical PFETs or all vertical NFETs are thickened to increase gate-source capacitance. Preferably, individually selected FETs would have their gates thickened.

Figure 6:
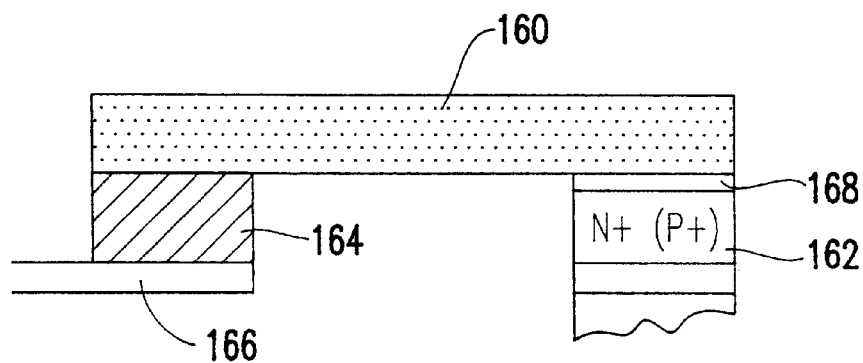
FIG. 6 is a cross-sectional view of a high resistance interdevice wiring strap between a device region and a gate for improving SRAM cell radiation hardness.

Another enhancement, in FIG. 6, is a high resistance interdevice wiring strap 160 that may be used to connect the drain or source 162 of one device through contact 164 to the gate 166 of another. A conductive barrier layer 168 is required between drain/source 162 and the high resistance strap 160 to prevent dopant in drain/source 162 from contaminating high resistance strap 160, lowering its resistance. Such an alternate embodiment SRAM, with cells including either of these variations would have improved radiation hardness, at a penalty of only a slightly longer cell write time.

Additionally, radiation protection may be further enhanced by forming a multi-layered gate oxide of a high permittivity material. For example, instead of $SiO_2$, the gate layer may be a Nitride-Oxide layer or an Oxide-Nitride-Oxide layer.

Figure 8:
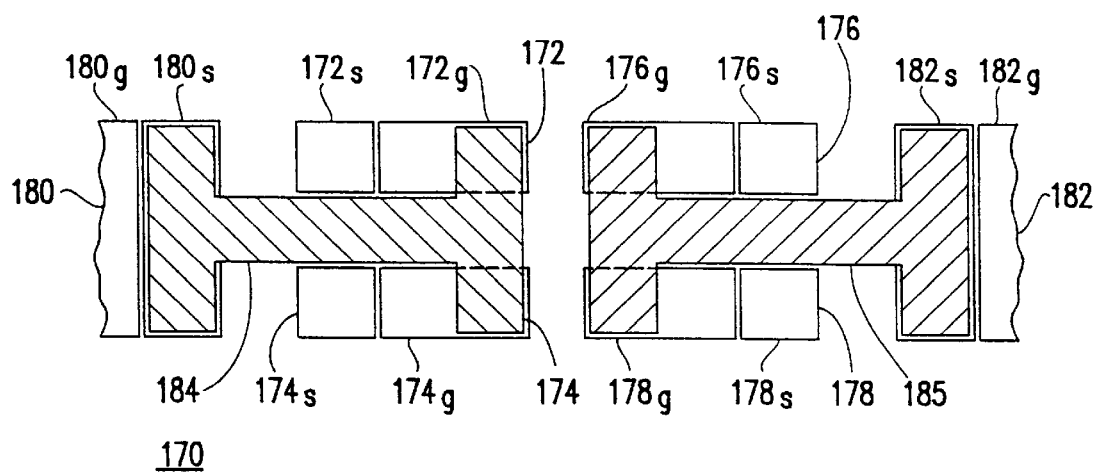
FIG. 8 is a plan view of a preferred embodiment cell of FIG. 7 showing the placement of preferred FETs in the cell.
Figure 7:
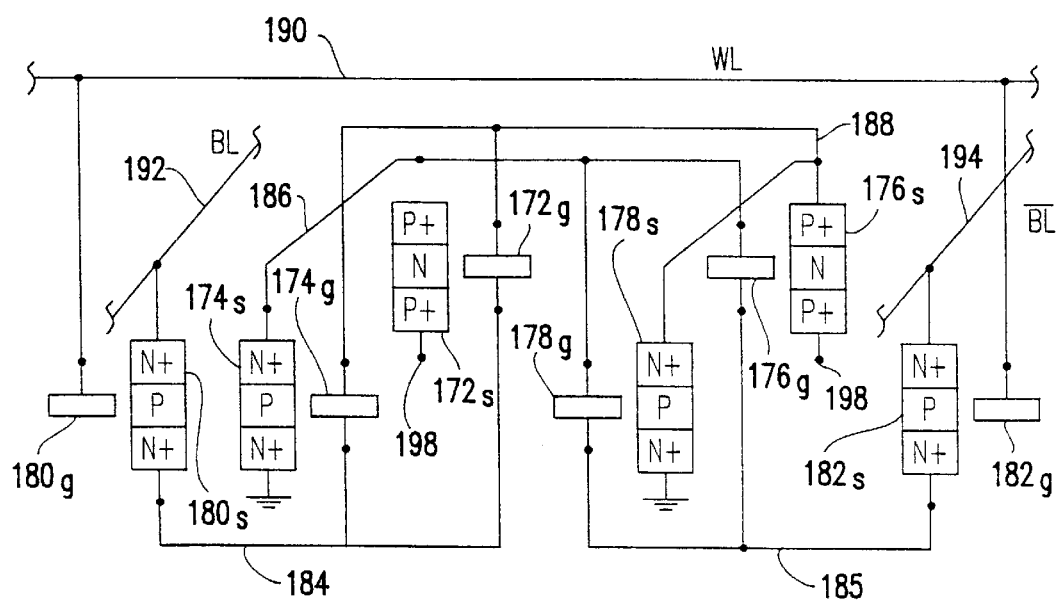
FIG. 7 is a topographical schematic of a preferred embodiment six device SRAM cell.

FIG. 7 is a topographical schematic of a preferred embodiment six device SRAM cell 170. FIG. 8 represents the placement of the six vertical transistors 172, 174, 176, 178, 180 and 182 in the preferred embodiment SRAM cell 170 of FIG. 7. Each transistor 172–182 includes a vertical layered epi stack $172_s$ to $182_s$ and gate $172_g$ to $182_g$. Low resistance straps 184 and 185, preferably a metal such as W, Al, Cu, a silicide or a laminate thereof, connect the source of cell pass gates 180 and 182 to the cell latch's internal nodes through the gates of corresponding latch devices 172, 174 and 176, 178, respectively. Gates $180_g$ and $182_g$ are shared with adjacent cells (not shown).

Figure 9B:
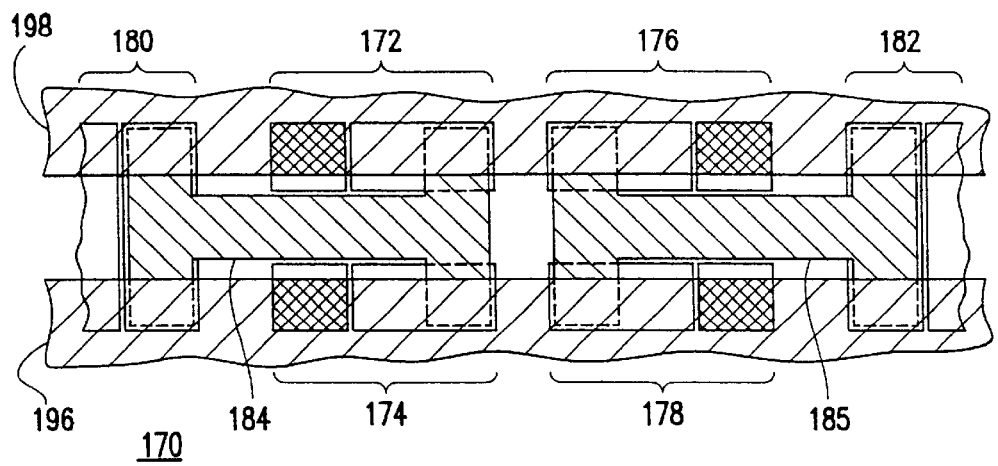
FIG. 9B is a plan view of cell I/O and latch wiring on the surface shown in FIG. 8.
Figure 9A:
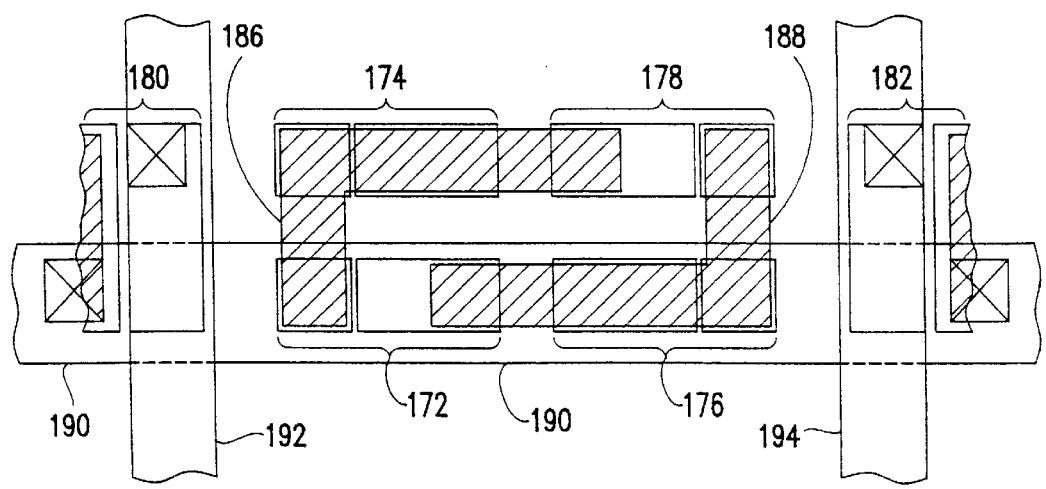
FIG. 9A is a plan view of cell I/O and latch wiring on the surface opposite the surface shown in FIG. 8.

FIGS. 9A–B represent the cell 170 including the cell wiring in FIG. 7 not shown in FIG. 8. Internal straps 186, 188, which complete latch wiring, are on the surface opposite that shown in FIG. 8. Internal straps 186, 188 are low resistance wiring or, optionally, are high resistance straps of FIG. 6. Gates $180_g$ and $182_g$ are connected to word line 190. The drains of devices 180 and 182 are connected to a complementary bit line pair 192, 194. The word line 190 and complementary bit line pair 192, 194 are shared with adjacent cells (not shown).

In FIG. 9B, the source of devices 174 and 178 are connected to ground 196 and the sources of devices 172, 176 are connected to an array supply voltage 198. Ground line 196 and supply line 198 are shared with adjacent cells (not shown). An array of such preferred embodiment SRAM cells 170 is much denser than prior art SRAM arrays.

In yet another preferred embodiment, the individual vertical device of the first preferred embodiment is expanded and adapted for forming very dense logic devices, e.g., CMOS NAND and NOR gates. In this preferred embodiment, two or more vertical devices are formed in the same device region or stack. Thus, two or more vertical devices may be stacked in a single stack, effectively connected in series, for further density improvement; or, two or more gates may be provided to the same channel of a single vertical device region, e.g., at opposite sides, to form two or more parallel FETs. Thus, by combining series connected stacked devices of one type with parallel FETs of the other type, very compact CMOS gates (NAND, NOR) are formed.

Figure 10A:
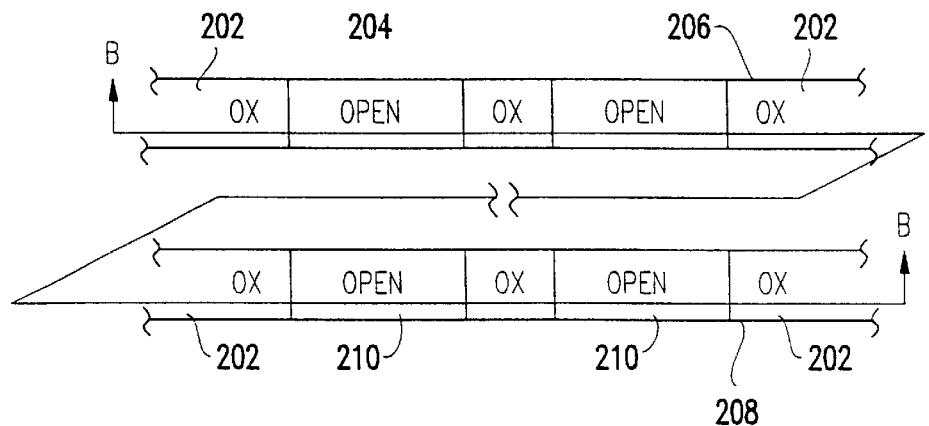
Figure 10B:
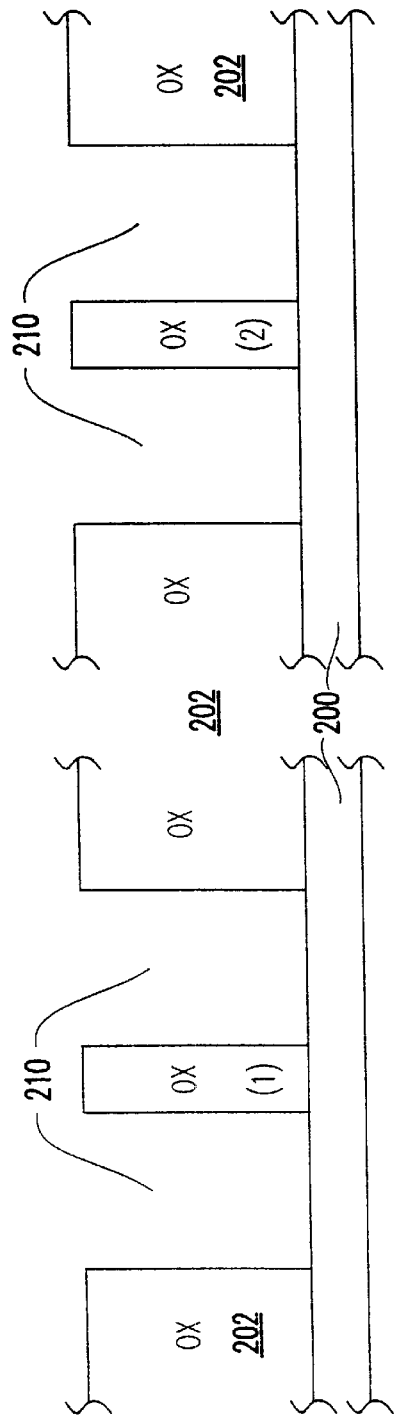

FIGS. 10A–H represent forming a two input gate according to the steps in FIG. 1. In this example a two input NAND gate is formed, as represented schematically in FIG. 11A. FIG. 10A is a top view after step 52, analogous to FIG. 2A. FIGS. 10B–H are cross-sectional views through B—B and are analogous to stages of the individual transistor preferred embodiment in FIGS. 2B and 3A–3F.

Unless specifically indicated otherwise, all materials, dimensions and other parameters are identical for the multiple transistor example of FIGS. 10A–H as for the individual transistor embodiment of FIGS. 2A–B and 3A–3F. So, the wafer in FIGS. 10A and 10B, includes a semiconductor base layer 200, preferably silicon, an oxide layer 202 on the base layer 200 and a surface nitride layer 204.

An N device trench 206 and a P device trench 208 are opened through the nitride surface layer 204, exposing the oxide layer 202 therebelow. Slots 210 are opened through the oxide layer 202 to the silicon wafer 200 in the trench 206. Preferably, as in the individual vertical embodiment, slots 210 are oriented along the wafer's <100> plane to maximize carrier mobility and minimize surface state density.

Figure 10C:
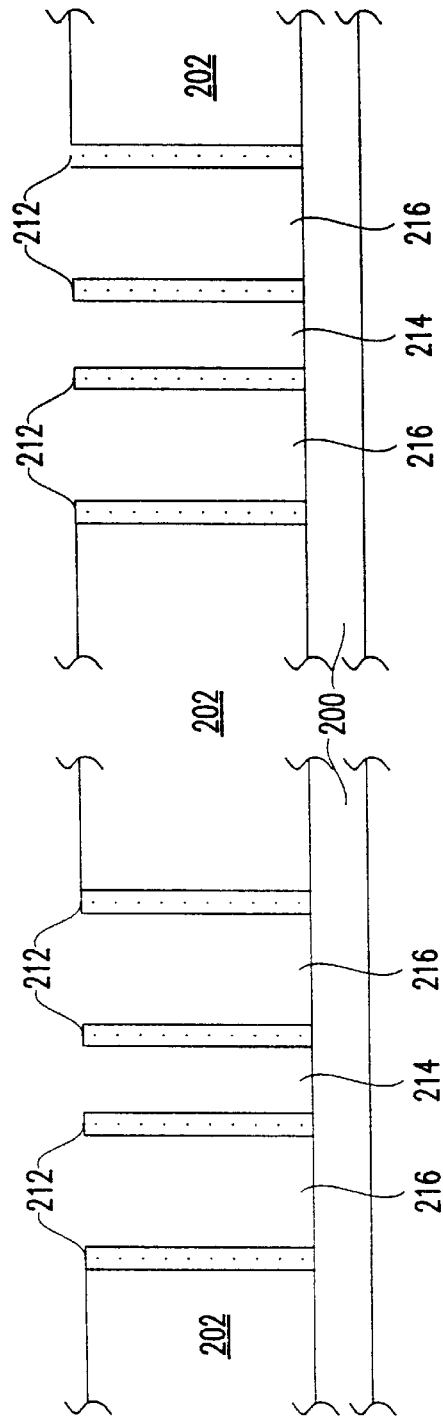

Next, in step 54 as represented in FIG. 10C, nitride sidewall spacers 212 are formed in the slots 210. A conformal nitride layer is deposited over the trenches 206, 208 and into the slots 210. The nitride layer is then reactive ion etched to remove it from horizontal surfaces, leaving sidewall spacers 212 standing in the slots 210, lining the oxide. Then, the oxide is selectively removed between adjacent slots 210, leaving only nitride sidewall spacers 212 behind. Unlike FIG. 3A above, none of the sidewall spacers 212 are removed for the multiple device embodiment. Thus, the sidewall spacers 212 form vertical device regions 214 and gate regions 216.

Figure 10D:
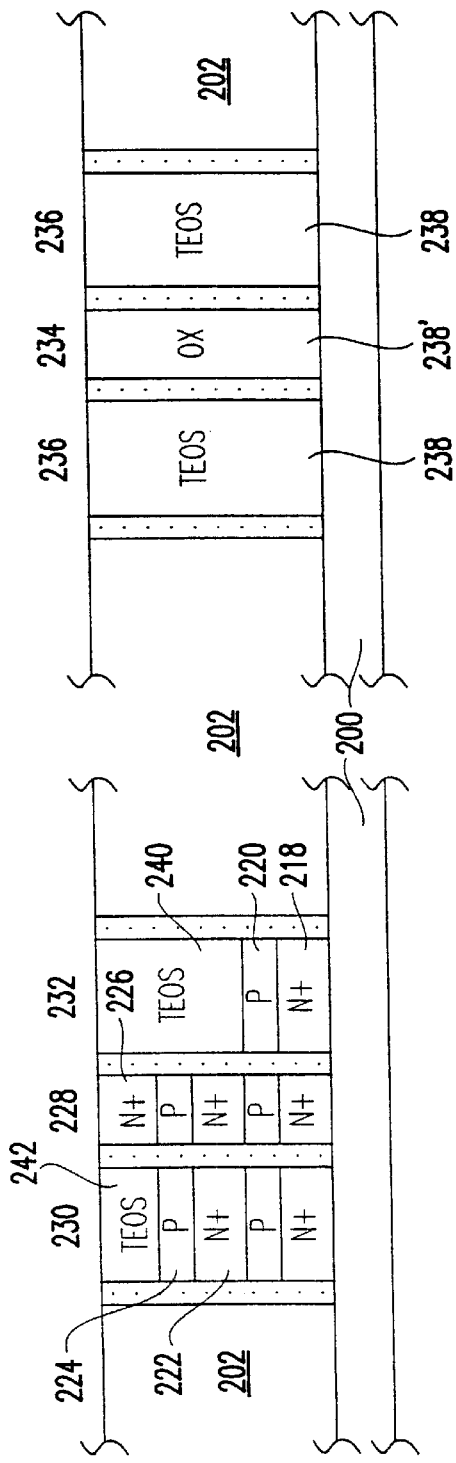

Next, in step 56 as represented in FIG. 10D, a layered epi is formed for the two stacked N-type FETS. Layers 218, 220, 222, 224 and 226, are grown epitaxially in N-type device region 228 and, selectively in gate regions 230, 232. However, P-type device region 234 and gate region 236 are filled with TEOS to avoid prematurely forming the epi layers there. The PFET regions are protectively masked during NFET formation.

First, N-type layer 218 and P-type layer 220 are epitaxially grown in N-type regions 228, 230 and 232. TEOS is deposited in all three regions and, then, selectively removed from regions 228 and 230, leaving gate region 232 filled with a TEOS plug 240 above layer 220.

Next, N-type layer 222 and P-type layer 224 are epitaxially grown in N-type regions 228 and 230. TEOS is deposited in both regions 228 and 230 and, then, selectively removed from device region 228, leaving gate region 230 filled with a TEOS plug 242 above layer 224. Finally, N-type layer 226 is epitaxially grown in N-type device region 228 to complete the series NPNPN structure of the stacked N-type FETs.

Figure 10E:
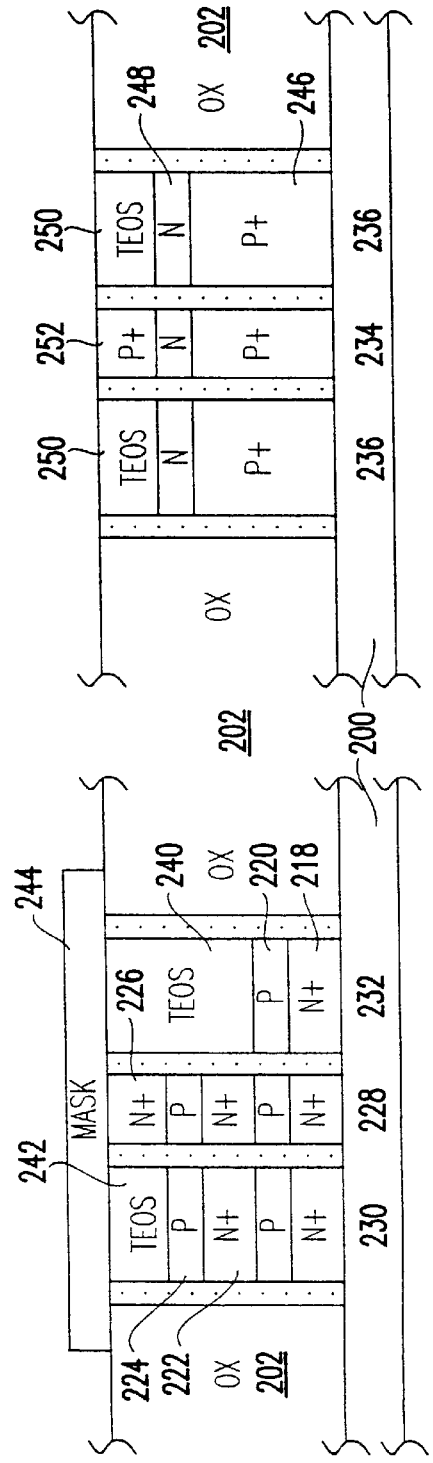
Figure 10F:
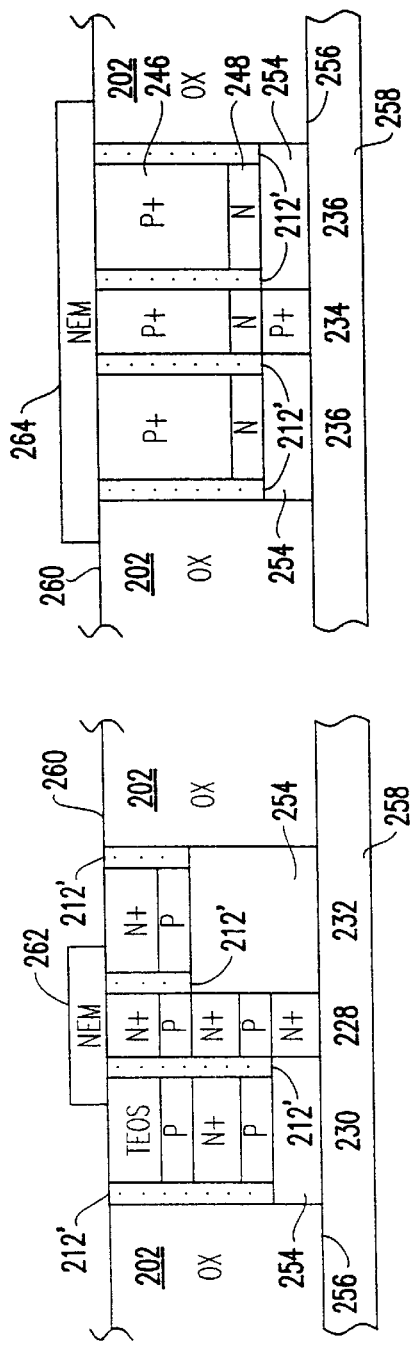

Next, in step 58, the second type (PFET) layered epi is grown for a pair of parallel PFETs. A mask 244 in FIG. 10E, is formed over N-type regions 228, 230 and 232 and oxide 238, 238' is removed from the P-type gate regions 236 and from P-type device region 234. P-type layer 246 and N-type layer 248 are formed in device region 234 and gate areas 236. Next, PFET regions 234, 236 are filled with TEOS, which is removed from device region 234, leaving plugs 250 in the gate regions 236. Finally, P-type device layer 252 is grown epitaxially in device region 234.

Plugs 240, 242 and 250 are removed, partially exposing nitride sidewall spacers 212. The exposed potions of each nitride sidewall spacer 212 is removed leaving partial spacers 212' in FIG. 10F in gate regions 230, 232 and 236, and partially exposing device regions 228 and 234. Oxide fill 254 is formed along the exposed sides of device regions 228 and 234 and the wafer is planarized leaving planar surface 256.

The wafer is inverted and the semiconductor base wafer 200 is removed. So, a handle wafer 258 is attached to planarized surface 256 and, then, base wafer 200 is removed using CMP and etching to expose surface 260. The buried etch stop layer allows removing the bulk of the base layer 200 using etching and CMP at a relatively rapid rate until the etch stop layer is exposed and the remaining base layer is removed at a slower more controlled rate thereafter. Etchants such as ethylenediamine-pyrocatecho-water (EPW) or potassium hydroxide (KOH) are known to stop at a boron doped buried layer such as was formed above when the wafer was prepared by implanting the heavily doped layer. Alternatively, the base layer 200 is etched using RIE until oxide by-products are detected.

Gates are formed for the first type devices in step 60, after removing the base layer 200. A non-erodible mask (NEM) 262, 264 (sometimes referred to in the art as a ▒hard mask▒) is formed on N device region 228 and P-type gate and device regions 234, 236, respectively. Then, the epi layers are etched from unprotected N-type gate regions 230, 232, removing layers 218 and 220 in gate region 232 and layers 218, 220, 222 and 224 in gate region 230. As these silicon layers are removed, the sidewall spacers 212' in gate regions 230 and 232, are re-exposed in the N-type region. These re-exposed sidewall spacers 212' are removed, preferably by isotropic etching, to expose the vertical channel surface, 266, 268, i.e., the exposed side of layers 220, 224. Then, the mask 262 is selectively removed from the N-type regions.

Figure 10G:
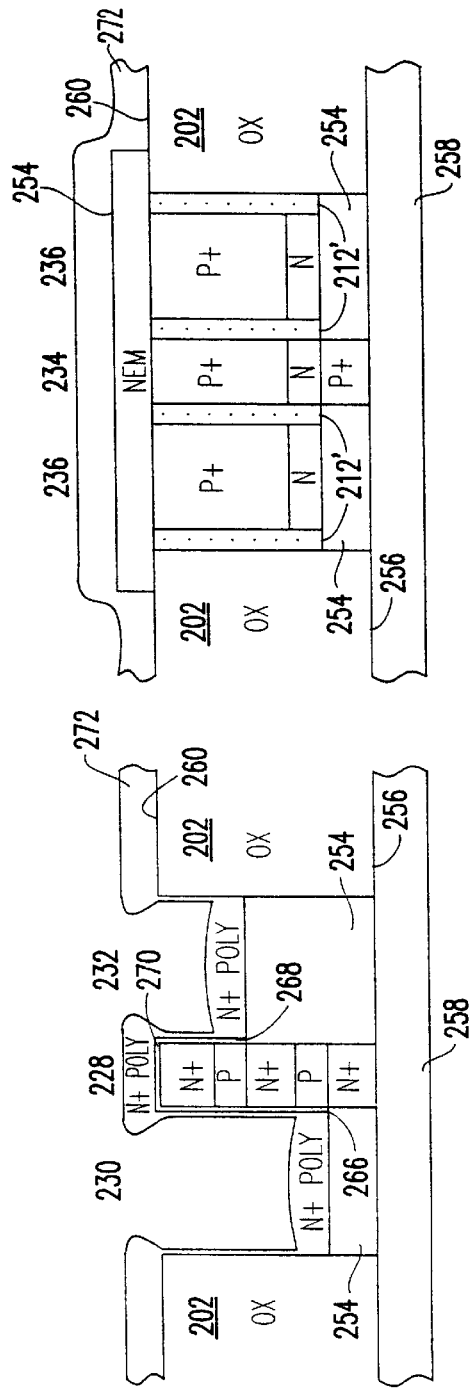

Next, a gate oxide layer 270 in FIG. 10G, is grown on the exposed silicon and a gate layer 272 is formed on the gate oxide layer 270. Preferably, the gate layer 272 is the same thickness as, or slightly thicker than channel layers 220 and 224 to assure sufficient channel overlap by the gate. As in the individual device preferred embodiment FET, the gate layer 272 is a directionally deposited doped polysilicon layer, deposited by collimated sputtering from a silicon target to achieve the ▒breadloafing▒ effect.

Unwanted areas of gate layer 272 are etched isotropically using CDE to leave polysilicon only on horizontal surfaces, with gates 272' and 272" in FIG. 10H, thick enough to span each respective channel 266 and 268 without excessive overlap. Remaining mask 264 is removed and TEOS is deposited over the wafer to fill spaces 274 above the gates 272', 272" of the stacked N-type transistors. Excess TEOS and surface polysilicon is removed.

In step 62, gates are formed for the vertical P-type transistors, repeating the steps as described for the N-type devices. So, first, the N-type devices and the P-type device region 234 are masked and silicon layers 246 and 248 are removed from P-type gate areas 234 to expose sidewall spacers 212'. Then, the sidewall spacers 212' and remaining mask structures may be removed. A gate oxide layer 276 is formed on exposed silicon and a polysilicon gate layer is sputtered onto the gate oxide layer 276. Excess polysilicon is removed to form gates 278, 280. TEOS plugs 282, 284 plug the spaces above the gates 278, 280. The structure thus formed is similar to the individual device stack structure of FIG. 3E.

Figure 11B:
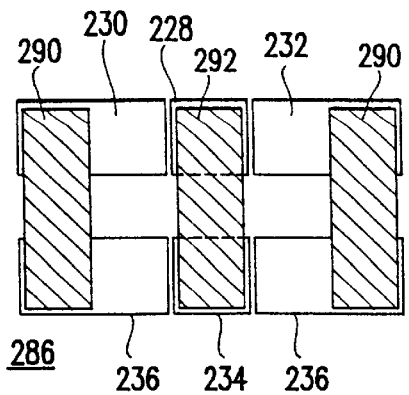
FIG. 11B is a plan view of I/O connections in the preferred embodiment logic gate of FIG. 11A.
Figure 11A:
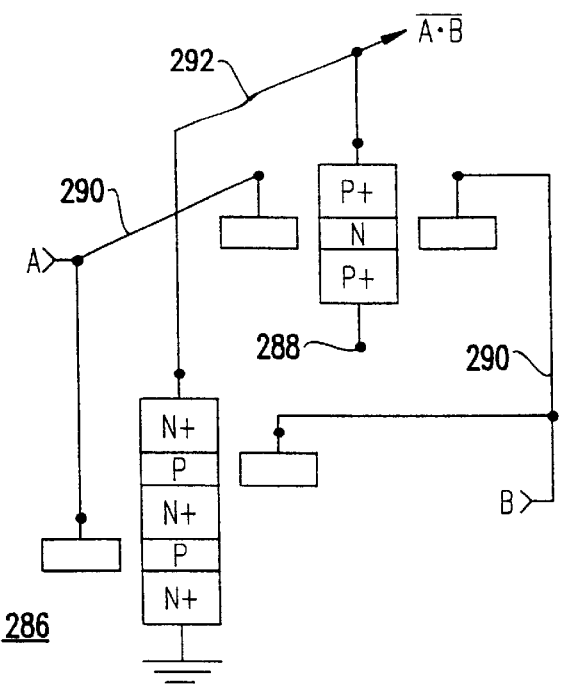
FIG. 11A is a topographical schematic representation of preferred embodiment logic gate according to FIGS. 10A–H.

I/O connections are formed for the logic gate example of FIGS. 10A–H as represented in FIG. 11B and schematically represented in FIG. 11A, which is, in this example, a two input NAND gate 286. The connections of FIG. 11B may be formed on either surface. Besides the ground connection and supply connection 288 in FIG. 11A, NAND gate 286 has a pair of input straps 290 and an output strap 292. The output strap 292 couples NFET device region 228 with PFET device region 234. The input straps 290 couple NFET gates 272' and 272" in gate regions 230 and 232 with PFET gates 278 and 280, respectively, in gate regions 236. In the preferred embodiment, ground and supply connections are made prior to step 64 of forming straps 290, 292 instead of as part of step 66.

Figure 12B:
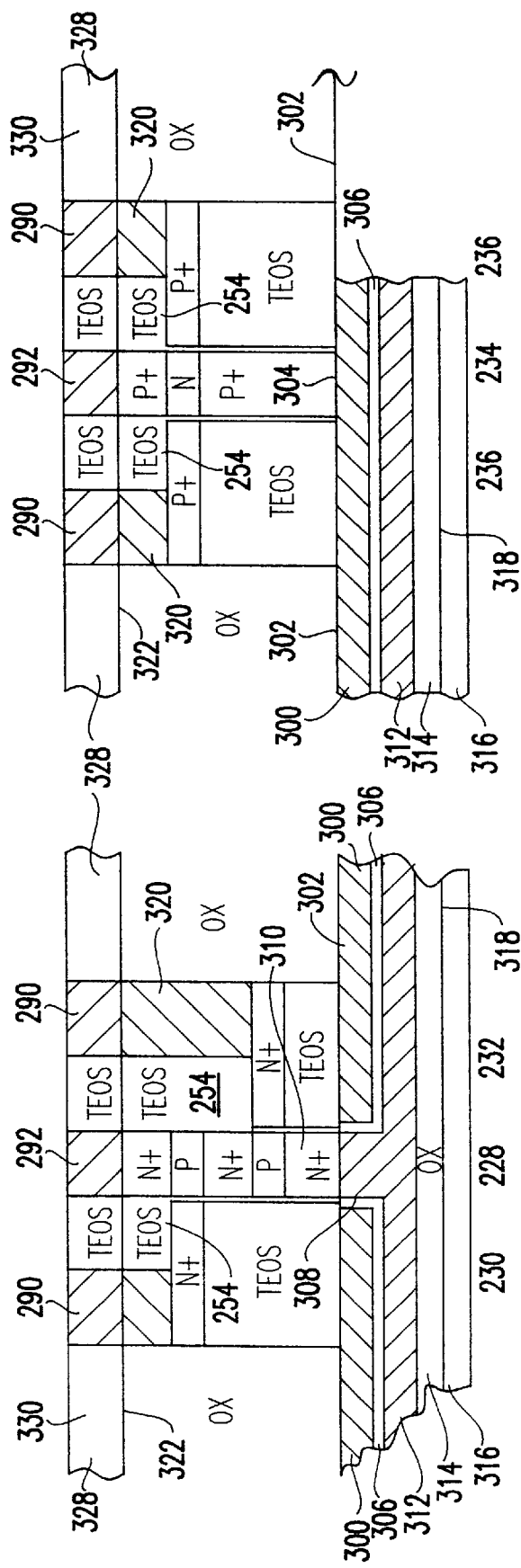
Figure 12C:
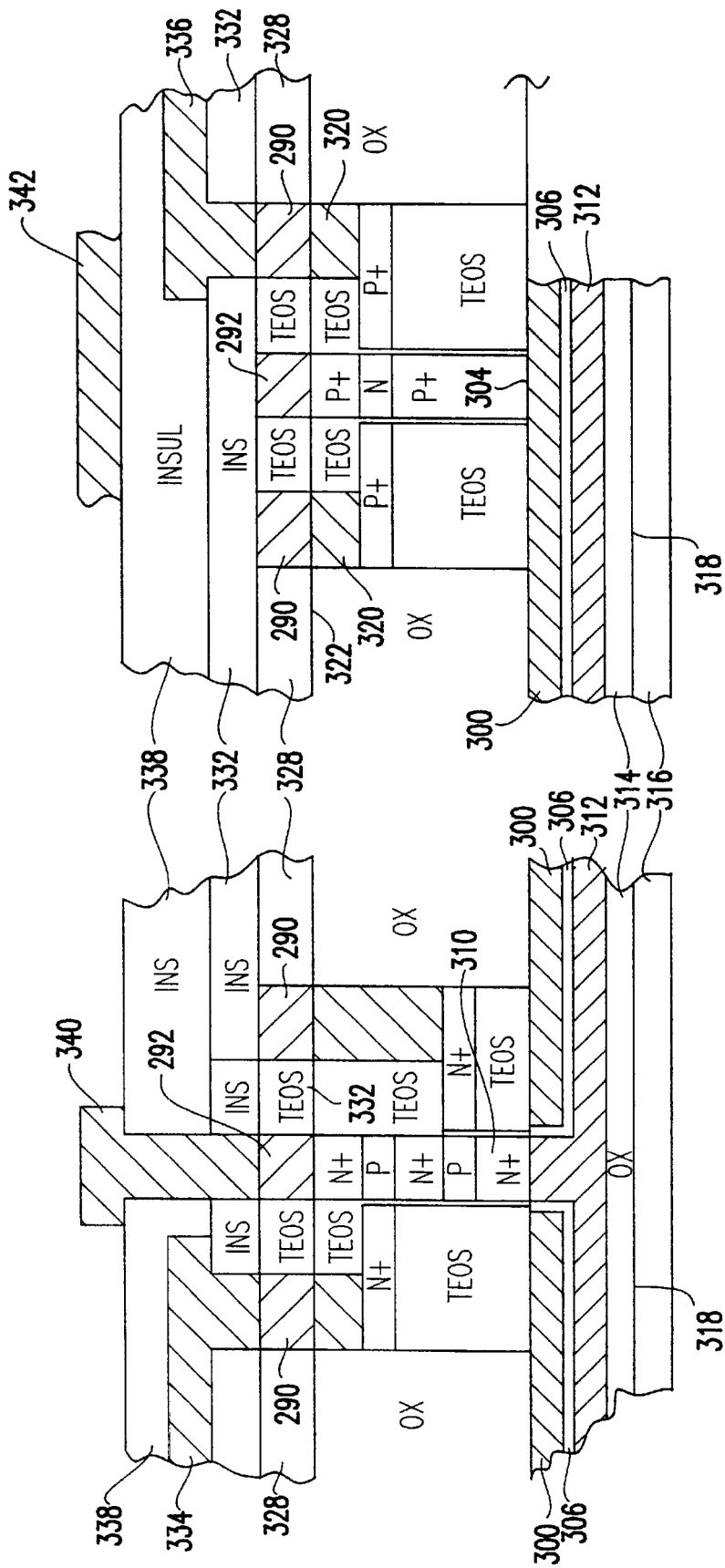

Traditional chip wiring, on a single chip surface, is inadequate for such a vertical logic gate as it is with the preferred embodiment SRAM cell. Thus, appropriate connections for Ground, $V_h$, as well as to the two (2) inputs 290 and output 292 are formed in steps 64 and 66 as represented in FIGS. 12A–C, which provide a cross-sectional view of the two input NAND gate formed in FIGS. 10A–H. The NAND gate includes a pair of stacked NFETs 228 and a pair of parallel PFETs 234.

First, as noted above, the ground and supply layers are formed. With the handle layer 258 still attached, a metal layer 300 in FIG. 12A is deposited on the surface 302 of the wafer to provide $V_h$ to the P-type device area 234. Thus, the supply layer 300 contacts the source 304 of the parallel PFETs 234. The supply layer 300 is patterned using any appropriate photolithographic patterning technique.

Preferably, ground lines are formed above the supply layer 300 to maximize decoupling capacitance. So, a layer 306 of high dielectric material, such as Barium-Strontium-Titanate oxide (BST) or Tantalum Pentoxide is deposited on the patterned supply layer 300. Ground contacts 308 are opened through the dielectric layer 306 and supply layer 300 to the source 310 of the NFET transistor stack 228. A ground layer 312 of metal is deposited on the high dielectric layer 306, contacting the exposed source 310 in device region 228. An insulating layer 314, preferably $SiO_2$, is formed over the ground layer 312. The insulating layer 314 is planarized using CMP or any appropriate planarization technique. It should be appreciated that the ground layer 312 could be formed on surface 302 prior to forming supply layer 300 without departing from the present invention.

A silicon wafer 316 is attached to the planarized surface 318 of layer 314 and the wafer is inverted for step 64. The handle wafer 258 is removed and contact vias 320 in FIG. 12B are etched, preferably using RIE, through oxide fill 254 to gates 272', 272", 278 and 280 in gate regions 230, 232, and 236 respectively. Then, the contact vias 320 are filled with a conductor, preferably Tungsten, and the surface 322 is planarized, preferably using any well known CMP technique.

The NAND gate wiring, 290, 292 of FIGS. 11A–B is formed in step 64 on the planarized surface 322 to gate contacts 320 and drains 324 and 326. An oxide layer 328 is deposited on the surface 322 filling spaces between wiring lands 290, 292. The oxide layer 328 is planarized forming planar surface 330.

Chip wiring, connecting the logic gate to other logic gates, is formed on the planarized surface 330 in step 66. An insulating layer 332 in FIG. 12C is formed on surface 322 and patterned to open contact vias to inputs 290. Alternatively, oxide layer 328 may be formed to a thickness sufficient to omit this insulating layer 332. A conducting layer, preferably a metal, is deposited on the insulating layer 332 and patterned to form the first interconnection layer, including input connections 334, 336 to inputs 290.

Next, an insulating layer 338 is formed on the first interconnection layer. Preferably, both insulating layers 332 and 338 are of a low dielectric material such as $SiO_2$, an insulating polymer or air to reduce wiring capacitance. Contacts are opened through both insulating layers 332 and 338 as required to output 290. A final layer of conducting material is deposited on the patterned insulating layer 338. The final metal layer is patterned to form the second interconnection layer, including connection 340 to output 290 and wiring land 342.

Once the final metal layer has been formed in step 66, if desired, the wafer may be further passivated with an appropriate passivation layer (not shown) and provided with suitable terminal metal layers (not shown) for off chip connection.

While the invention has been described in terms of preferred embodiments, those skilled in the art will recognize that the invention can be practiced with modification within the spirit and scope of the appended claims.

We claim:

1. A Field Effect Transistor (FET) comprising:
   a substrate;
   a layered semiconductor stack having a channel layer of a first conduction type between a pair of layers of a second conduction type, wherein each of the layers in said semiconductor stack have the same width dimension;
   a metallic wiring layer attached to said stack adjacent one of said pair of layers, said metallic wiring layer residing between said substrate and said one of said pair of layers;
   a gate insulator layer on a sidewall of said semiconductor stack; and
   a gate layer, only a first side of said gate layer adjacent said gate insulator layer extending substantially along said channel layer, said side forming a gate of the FET, and wherein said gate layer has the same thickness as and is in alignment with said channel layer.

2. The FET of claim 1 wherein semiconductor stack is a silicon stack.

3. The FET of claim 2 wherein the silicon stack is an epitaxially grown silicon stack.

4. The FET of claim 3 wherein the first conduction type is P-type and the second conduction type is N-type.

5. The FET of claim 3 wherein the first conduction type is N-type and the second conduction type is P-type.

6. The FET of claim 3 wherein the gate insulator layer comprises a layer of $SiO_2$.

7. The FET of claim 6 wherein the gate insulator layer further comprises a nitride layer.

8. The FET of claim 7 wherein the gate insulator layer comprises a layer of ONO.

9. The FET of claim 3 wherein the gate layer is a layer of polysilicon.

10. An integrated circuit (IC) including a plurality of Field Effect Transistors (FETs), comprising:
    a first layered epitaxial semiconductor stack having a first channel layer of a first conduction type between first and second layers of a second conduction type, wherein each of the layers in said first layered epitaxial semiconductor stack have a same width dimension;
    a second layered epitaxial semiconductor stack having a second channel layer of said second conduction type between third and fourth layers of said first conduction type, wherein each of the layers in said second layered epitaxial semiconductor stack have a same width dimension;
    gate insulator layers on sidewalls of said epitaxial semiconductor stacks; and
    gate layers, only one side of each of said gate layers adjacent said gate insulator layers, said sides each forming a gate of first and second FETs, respectively, wherein said gate layers are in alignment with said first and second channel layers, and wherein the first FET in the first layered epitaxial stack and the second FET in the second layered epitaxial stack form one inverter of a cross coupled pair of inverters in an SRAM cell.

11. The IC of claim 10 wherein each of the epitaxial semiconductor stacks are an epitaxially grown silicon stack.

12. The IC of claim 10, wherein the first conduction type is P-type and the second conduction type is N-type.

13. The IC of claim 10, wherein the first conduction type is N-type and the second conduction type is P-type.

14. A logic gate including at least one pair of Field Effect Transistors (FETs), said at least one pair of FETs comprising:
    a layered epitaxial semiconductor stack having a first channel and a second channel of a first conduction type, said first channel being between first and second layers of a second conduction type and said second channel being between said second layer and a third layer of said second conduction type;
    a first gate insulator layer on a first sidewall of said layered epitaxial semiconductor stack;
    a second gate insulator layer on a second sidewall of said epitaxial semiconductor stack;
    a first gate layer, only one side of said first gate layer adjacent said first gate insulator layer extending substantially along said first channel, said side of said first gate layer forming a first FET's gate; and
    a second gate layer, only one side of said second gate layer adjacent said second gate insulator layer extending substantially along said second channel, said side of said second gate layer forming a second FET's gate.

15. The logic gate of claim 14 further comprising:
    a second layered epitaxial semiconductor stack having a third channel of said second conduction type, said third channel being between fourth and fifth layers of said first conduction type;
    third and fourth gate insulator layers on different sidewalls of said second layered epitaxial semiconductor stack;
    a third gate layer, a side of said third gate layer adjacent said third gate insulator layer extending along said third channel, said side of said third gate layer forming a third FET's gate;
    a fourth gate layer, a side of said fourth gate layer adjacent said fourth gate insulator layer extending along said third channel, said side of said fourth gate layer forming a fourth FET's gate; and
    a strap, said fourth layer being connected by said strap to said third layer.

16. A logic gate including at least two pair of Field Effect Transistors (FETs), comprising:
    a first layered epitaxial semiconductor stack having a first channel and a second channel of P-type, said first channel being between first and second layers of N-type and said second channel being between said second layer and a third layer of N-type;
    a first sate insulator layer on a first sidewall of said first layered epitaxial semiconductor stack;
    a second gate insulator layer on a second sidewall of said first layered epitaxial semiconductor stack;
    a first gate layer, a side of said first gate layer adjacent said first gate insulator layer extending along said first channel, the side of said first gate layer forming a first FET's gate;
    a second gate layer, a side of said second gate layer adjacent said second gate insulator layer extending along said second channel, the side of said second gate layer forming a second FET's gate;
    a second layered epitaxial semiconductor stack having a third channel of N-type, said third channel being between fourth and fifth layers of P-type;
    third and fourth gate insulator layers on different sidewalls of said second layered epitaxial semiconductor stack;

a third gate layer, a side of said third gate layer adjacent said third gate insulator layer extending along said third channel, the side of said third gate layer forming a third FET's gate;

a fourth gate layer, a side of said fourth gate layer adjacent said fourth gate insulator layer extending along said third channel, the side of said fourth gate layer forming a fourth FET's gate; and a strap, said fourth layer being connected by said strap to said third layer, wherein said logic gate is a NAND gate, a first input being connected to said first FET's gate and said third FET's gate, a second input being connected to said second FET's gate and said fourth FET's gate, and said strap being an output of said logic gate.

17. A logic gate including at least two pair of Field Effect Transistors (FETs), comprising:

a first Iayered epitaxial semiconductor stack having a first channel and a second channel of N-type, said first channel being between first and second layers of P-type and said second channel being between second layer and a third layer of P-type;

a first gate insulator layer on a first sidewall of said first layered epitaxial semiconductor stack;

a second gate insulator layer on a second sidewall of said first layered epitaxial semiconductor stack;

a first gate layer, a side of said first gate layer adjacent said first gate insulator layer extending along said first channel, the side of said first gate layer forming a first FET's gate;

a second gate layer, a side of said second gate layer adjacent said second gate insulator layer extending along said second channel, the side of said second gate layer forming a second FET's gate;

a second layered epitaxial semiconductor stack having a third channel of P-type, said third channel being between fourth and fifth layers of N-type;

third and fourth gate insulator layers on different sidewalls of said second layered epitaxial semiconductor stack;

a third gate layer, a side of said third gate layer adjacent said third gate insulator layer extending along said third channel, the side of said third gate layer forming a third FET's gate;

a fourth gate layer, a side of said fourth gate layer adjacent said fourth gate insulator layer extending along said third channel, the side of said fourth gate layer forming a fourth FET's gate; and a strap, said fourth layer being connected by said strap to said third layer, wherein said logic gate is a NOR gate, a first input being connected to said first FET's gate and said third FET's gate, a second input being connected to said second FET's gate and said fourth FET's gate, and said strap being an output of said logic gate.

18. An array of SRAM cells, each of said SRAM cells comprising:

a pair of cross coupled inventors, each said inverters including a pair of vertical FETs, each of said vertical FETs comprising:

a layered epitaxial silicon stack, said layered epitaxial silicon stack comprising a source layer, a channel layer on said source layer and a drain layer on said channel layer, a gate insulator layer at a sidewall of said channel layer, and a polysilicon gate layer, a side of said gate extending substantially along said channel layer forming said FET's gate; and a pair of pass gates, each said pass gate being an individual said vertical FET and coupled to one side of said cross coupled inverters, wherein the pair FETs in the cross coupled inverters are a PFET and a NFET, the pass gates are NFETs, and the polysilicon gate layer of the PFET is substantially thicker than the channel layer.

19. An array of SRAM cells, each of said SRAM cells comprising:

a pair of cross coupled inventors, each said inverters including a pair of vertical FETs, each of said vertical FETs comprising:

a layered epitaxial silicon stack, said layered epitaxial silicon stack comprising a source layer, a channel layer on said source layer and a drain layer on said channel layer, a gate insulator layer at a sidewall of said channel layer, and a polysilicon gate layer, a side of said gate extending substantially along said channel layer forming said FET's gate;

a pair of pass gates, each said pass gate being an individual said vertical FET and coupled to one side of said cross coupled inverters; and at least one resistive strap connecting the output of one of said inverters to the other inverter's input, whereby a level change at said output is delayed from reaching said input, wherein the pair FETs in the cross coupled inverters are a PFET and a NFET and the pass gates are NFETs.

20. The array of claim 19 wherein at least one resistive strap is two resistive straps, each of said resistive straps connecting the output of one of said inverters to the other inverter's input, whereby a level change at one said output is delayed from reaching the other said input.

21. The FET of claim 1, wherein said pair of layers each have a thickness greater than a thickness of said channel layer.

22. The FET of claim 1, wherein a device channel length of said FET depends upon the thickness of said channel layer.

23. The FET of claim 1, wherein said pair of layers each have a same width.

24. The FET of claim 1, further comprising:

a plug layer adjacent one of an upper side and lower side of said gate layer;

an oxide spacer layer along the other of said upper side and lower side of said gate layer, said oxide spacer layer directly contacting one of said pair of layers and said plug layer being coplanar with the other of said pair of layers.

25. The FET of claim 24, wherein said plug layer and said one of an upper side and lower side of said gate layer having substantially the same width.

26. The FET of claim 24, wherein said oxide spacer layer and the other of said upper side and lower side of said gate layer having substantially the same width.

27. The FET of claim 24, further comprising:

a spacer adjacent a second side of said gate layer, said spacer separating the second side of said gate layer from an oxide layer.

28. An integrated circuit, comprising:
- a first layered epitaxial semiconductor stack having a first channel layer of a first conduction type between first and second layers of a second conduction type, and a second channel layer of said first conduction type between one of said first and second layers and a third layer of said second conduction type
- a second layered epitaxial semiconductor stack having a third channel layer of said second conduction type between fourth and fifth layers of said first conduction type;
- gate insulator layers on sidewalls of said epitaxial semiconductor stacks;
- a first gate layer aligned with the first channel layer;
- a second gate layer aligned with the second channel layer;
- a third gate layer aligned with and adjacent one side of the third channel layer; and
- a fourth gate layer aligned with and adjacent another side of the third channel layer,
- wherein said first and second layers, said first channel layer, and the first gate layer form a first FET, and said one of said first and second layers, said third layer, said second channel layer, and the second gate layer form a second FET, and
- wherein said fourth and fifth layers, third channel layer, and the third gate layer form a third FET, and said fourth and fifth layers and the fourth gate layer form a fourth FET.

29. The integrated circuit of claim 28, wherein the first, second, and third layers and the first and second channel layers in said first stack have a same width dimension, and wherein the fourth and fifth layers and the third channel layer in said second stack have a same width dimension.

30. The integrated circuit of claim 28, further comprising:
- a metal layer contacting one of said fourth layer and said fifth layer;
- a dielectric material formed on the metal layer;
- a ground layer formed on the dielectric layer; and
- an insulating layer formed on the ground layer.

31. The integrated circuit of claim 30, further comprising:
- a semiconductor substrate attached to said insulating layer,
- wherein none of said first gate layer, said second gate layer, said third gate layer, and said fourth gate layer are electrically linked.

32. The integrated circuit of claim 28, further comprising:
- a wiring layer connected to at least one of the third gate layer and the fourth gate layer; and
- an interconnect layer connected to said wiring layer.

33. The integrated circuit of claim 28, further comprising:
- a wiring layer connected to at least one of the first gate layer and the second gate layer; and
- an interconnect layer connected to said wiring layer.

* * * * *